(12) United States Patent
Darvish-Zadeh et al.

(10) Patent No.: US 7,053,709 B1
(45) Date of Patent: May 30, 2006

(54) LINEARIZATION OF AN AMPLIFIER

(75) Inventors: Mahmoud Darvish-Zadeh, Teddington (GB); Ahmad Khanifar, Surrey (GB); William Jenkins, London (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/129,860

(22) PCT Filed: Nov. 7, 2000

(86) PCT No.: PCT/EP00/10952

§ 371 (c)(1),
(2), (4) Date: Oct. 14, 2003

(87) PCT Pub. No.: WO01/37424

PCT Pub. Date: May 25, 2001

(30) Foreign Application Priority Data

Nov. 12, 1999 (GB) .................................. 9926886

(51) Int. Cl.
*H03F 1/26* (2006.01)
(52) U.S. Cl. ........................ 330/149; 330/136
(58) Field of Classification Search ................ 330/136, 330/149
See application file for complete search history.

(56) References Cited

U.S. PATENT DOCUMENTS

| 3,825,843 | A | | 7/1974 | Felsberg et al. ............. 328/163 |
| 5,049,832 | A | * | 9/1991 | Cavers ........................ 330/149 |
| 5,929,703 | A | * | 7/1999 | Sehier et al. ................ 330/149 |
| 6,054,896 | A | * | 4/2000 | Wright et al. ............... 330/149 |
| 6,075,411 | A | * | 6/2000 | Briffa et al. ................. 330/149 |
| 6,141,390 | A | * | 10/2000 | Cova ........................... 330/149 |
| 6,600,792 | B1 | * | 7/2003 | Antonio et al. ............. 330/149 |

FOREIGN PATENT DOCUMENTS

| EP | 0416 622 A2 | 3/1991 |
| EP | 0 751 614 A1 | 1/1997 |
| GB | 2 335 813 A | 9/1999 |

* cited by examiner

*Primary Examiner*—Khanh V. Nguyen
(74) *Attorney, Agent, or Firm*—Lackenbach Siegel, LLP

(57) ABSTRACT

The present invention relates to a method of linearization an amplifier (4) and also to amplifier circuitry. The method comprises the steps of generating a linearization signal (10) that substantially corresponds to low-frequency components of the square of an input signal (7) to the amplifier (4), processing the linearization signal, combining (15) the linearization signal with the input signal to form a modified input signal, and amplifying the modified input signal by means of the amplifier (4).

9 Claims, 8 Drawing Sheets

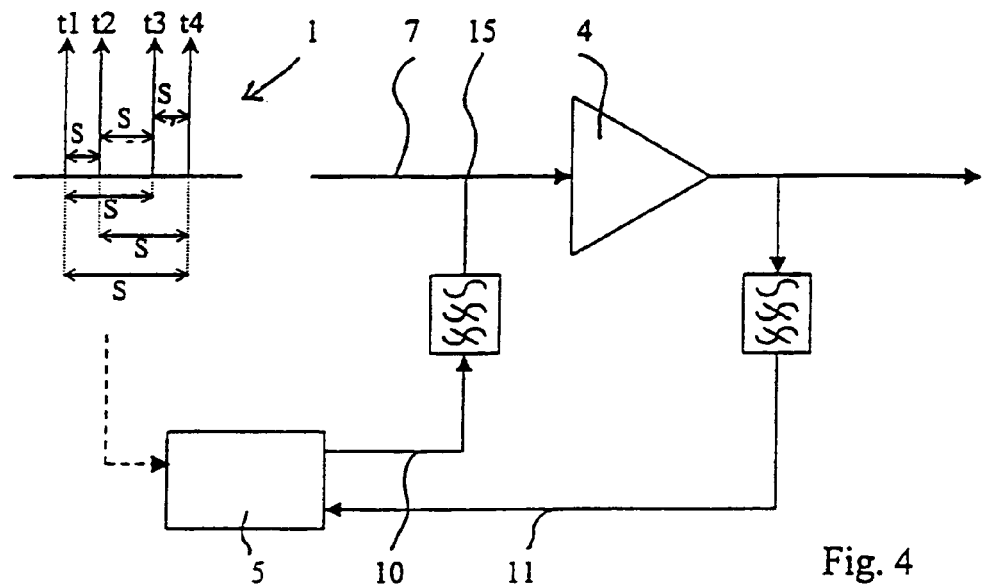
Fig. 4
Fig. 5
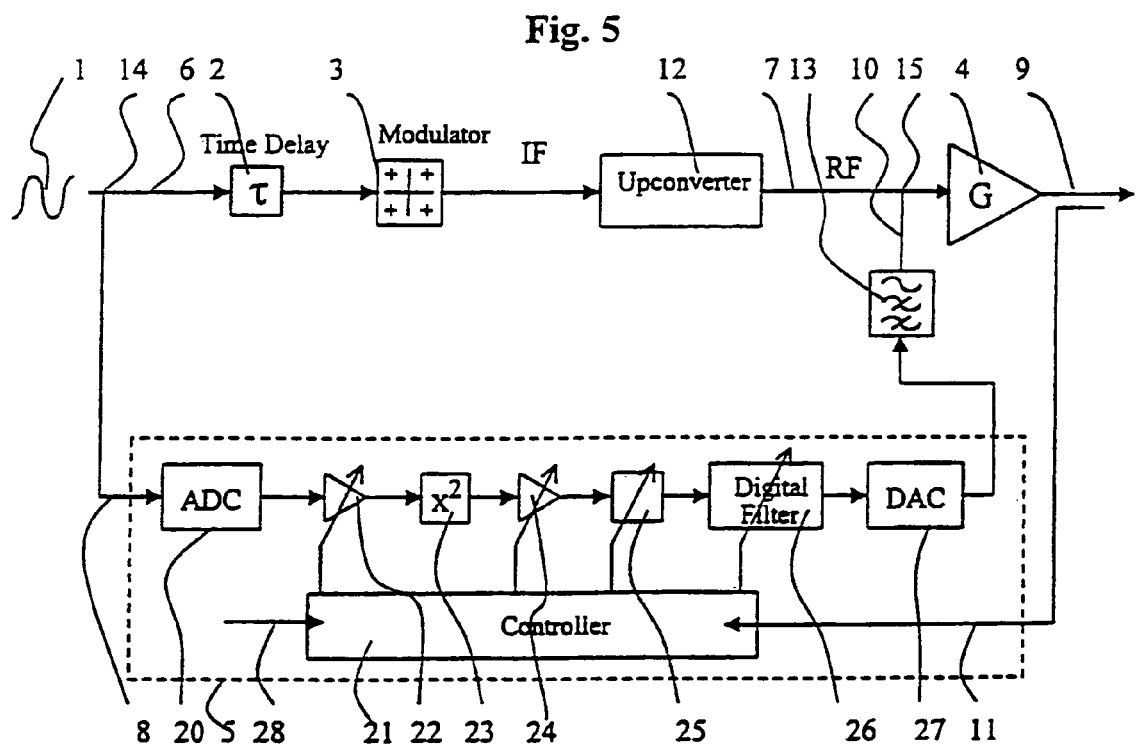

4 Tone Results

LINEARIZATION OF AN AMPLIFIER

FIELD OF THE INVENTION

The present invention relates to linearization of an amplifier and in particular, but not exclusively, to linearization of an amplifier for amplifying radio frequency signals.

BACKGROUND OF THE INVENTION

A communication system comprises signalling points or nodes, such as user terminals, different exchanges, routers, switches, links, stations and so on and an appropriate communication media between the signalling points. Signalling points may also be situated within an element of the communication system, wherein the communication may occur with the element. The communication media may comprise, for example, a wired interface, a radio interface or an optical interface. The communication may be carried by analogue or digital signals or a combination of these, such as digitally-modulated analogue signals.

Amplification is required in various communication applications. For example radio frequency signals transmitted between signalling points in a radio communication system may need to be amplified during some stage of the transmission and/or reception. The signalling points may be, for example, a transmitting station and a receiving station or an intermediate node of the communication system. The amplification of the signals is required since the amplitude of a signal tends to be attenuated during the transmission of the signal between the signalling points, thereby decreasing the quality of the transmission. Also, noise is added to the signal from other sources as well as from the transmitting and receiving and the possible intermediate apparatus itself. The communication system is thus provided with amplifying means to compensate for the attenuation and increase the signal-to-noise ratio of the signal by amplification of the signal.

Amplifiers intended to cover a range of frequencies should provide linear performance across the designated frequency band. Any amplifier introduces linear, or AM-PM (amplitude modulation-phase modulation) distortion, where amplitude variations in the input signal cause undesirable phase variations in the output signal, and intermodulation, or AM-AM distortion, causing mixing between the different frequency components present. An example of so-called third-order and fifth-order distortion components appearing around a simple two-tone signal at frequencies f1 and f2 is shown by FIG. 1. Although other distortion components are generated, these tend to be produced at frequencies that are significantly higher than the desired signals, allowing their easy removal with filtering. As illustrated, the magnitudes of the third-order distortion components are normally greater than the fifth-order components. Even though not illustrated in FIG. 1, seventh-order (or even higher odd-order) distortion components may also appear around the carrier signals. However, the third-, and to a lesser extent, the fifth-order distortion will dominate the nonlinearity of an amplifier in most cases.

The non-linearity of an amplifier is caused by the finite output power limitation and non-ideal transfer function of the amplifier. Therefore, it is often desirable to provide amplifiers with some kind of linearizing circuitry to reduce the distortion that is introduced. A straightforward solution to the linearity problem exploits the fact that the non-linearity increases with the output power level of the amplifier. Thus, if the input level is reduced, or "backed-off", the amplifier is arranged to operate only within its more linear region. However, this approach is not considered to be desirable in most applications as it fails to utilise the full range of available output voltage-swing and is therefore not power-efficient.

There are a number of well-established linearization techniques, which have been proposed over the years. One of the most well-known prior art techniques is referred to as feedforward (F/F) linearization. The configuration and basic operation of typical F/F circuitry is shown in FIG. 1. In the shown F/F arrangement an input signal consisting of two closely spaced tones is first sampled by a directional coupler in a location before the amplifier. The separated fraction of the clean, undistorted input signal is passed through an amplitude and phase-shifting network while the input signal is passed through the main amplifier. After the amplification, a further sample is separated from the amplified signal, said further sample including also the distorted components of the amplified signal. The two sampled signals are combined in a hybrid combiner in exact antiphase and with equal amplitudes in order to cancel the original two-tone signal, leaving an "error" signal that consists of only those distortion components that were introduced by the amplifier. The error signal is then amplified by an error amplifier and subsequently combined with the distorted output of the main amplifier, again in precise antiphase and with equal magnitude, removing the extraneous distortion components and leaving a clean amplified signal.

Feedforward linearizers are difficult to realize because all the components operate at radio frequency (RF), and the phase and amplitude tolerances of the two cancellation loops are very tight and susceptible to changes in temperature and ageing. In order to combat the aforementioned problems, a relatively complex control mechanism has to be added in order to maintain acceptable performance. The feedforward linearizers are also temperamental, complex and inefficient to operate. Due to the above reasons, feedforward linearizers are relatively expensive and may thus be unsuitable for some applications requiring linearization.

Another prior art linearization technique is predistortion. In predistortion the input signal is deliberately distorted prior to being inputted to the amplifier in a manner that is contrary to that distortion that the signal will experience in the amplifier itself, resulting in a "cleaner" signal. Both analogue and digital predistortion have been suggested. The predistortion systems may be constructed so as to form an open loop predistorter or a closed loop (i.e. adaptive) predistorter. The latter has the advantage of being able to adjust for device variations with temperature and time.

Predistortion linearizers operate to predistort the high-frequency carrier itself, and therefore suffer many of the drawbacks of F/F linearizers. The analogue predistortion linearizers operate only over a relatively small power range. The current digital predistortion linearizers employ a complex structure, being difficult and expensive to realize. Despite the complexity, even the digital predistortion linearizers have shown only a limited distortion improvement.

SUMMARY OF THE INVENTION

It is an aim of the embodiments of the present invention to address one or several of the above problems.

According to one aspect of the present invention, there is provided a method of linearizing an amplifier, the amplifier being provided for amplifying a signal, the method comprising steps of: generating a linearizing signal that substantially corresponds to the low-frequency components of the square of an input signal to the amplifier; processing the linearizing signal; combining the linearizing signal with the input signal to form a modified input signal; and amplifying the modified input signal by means of the amplifier.

According to a further aspect of the present invention provides circuitry comprising: an amplifier provided with an input for receiving a signal; processing means for generating a linearizing signal that substantially corresponds to the low-frequency components of the square of an input signal to the amplifier and for processing the linearizing signal with the input signal; and combiner means for combining the linearizing signal with the input signal to form a modified input signal to be applied to the input of the amplifier for amplification.

In more particular embodiments of the invention, the generation of the linearizing signal comprises squaring the baseband waveform of the input signal. Processing of the linearizing signal may comprise applying amplitude adjustment and phase-shift to the generated linearizing signal. Intermodulation distortion may be reduced at the output of the amplifier by means of addition of the linearizing signal to the input signal. The baseband waveform of the input signal may be obtained before the input signal is modulated and/or upconverted. At least a part of the generation and/or processing of the linearizing signal may be accomplished by means of digital signal processing. At least one analogue to digital or vice versa conversion of signals may be accomplished during the operation. The signals to be processed in the signal processor and the produced linearizing signal may be intermediate frequency signals. The baseband waveform of the input signal may be sampled. A copy of the baseband waveform of the input signal may be processed during the operation.

The signal processor may be provided with feedback information from the output of the amplifier. The processing of the linearizing signal may comprise conditioning of the linearizing signal based on said feedback information. Amplitude and phase correction may be accomplished by employing convolution to the time-varying waveform of the linearizing signal. The generation of the linearizing signal may be dynamically controlled.

The input signal may consist of two or more modulated carrier signals. The operation may comprise squaring two or more baseband waveforms and using information associated with the mutual relations between said carriers. The information concerning the mutual relations comprises carrier spacings between said one or more carriers.

The embodiments of the invention may enable efficient use of the amplifying range of an amplifier while reducing the intermodulation the distortion present in the signal outputted from the amplifier. The embodiments may enable an amplifying circuit with linearization functionality that is less complex than that of F/F linearizers. The embodiments may enable use of linearizing circuitry operating at substantially lower frequencies than those used in F/F linearizers. The linearizing circuitry components may also be realized digitally. Therefore, once an embodiment has been designed, the embodiment may be reproduced accurately. The linearizing circuitry designed in accordance with the embodiments of the invention may also be substantially immune to temperature changes and the passage of time, as well as being small in size and power consumption.

BRIEF DESCRIPTION OF DRAWINGS

For better understanding of the present invention, reference will now be made by way of example to the accompanying drawings in which:

FIG. 4 is a schematic representation of an embodiment of the present invention;

FIG. 5 is a block diagram of circuitry in accordance with a preferred embodiment of the present invention;

DESCRIPTION OF PREFERRED EMBODIMENTS OF THE INVENTION

Figure 1:
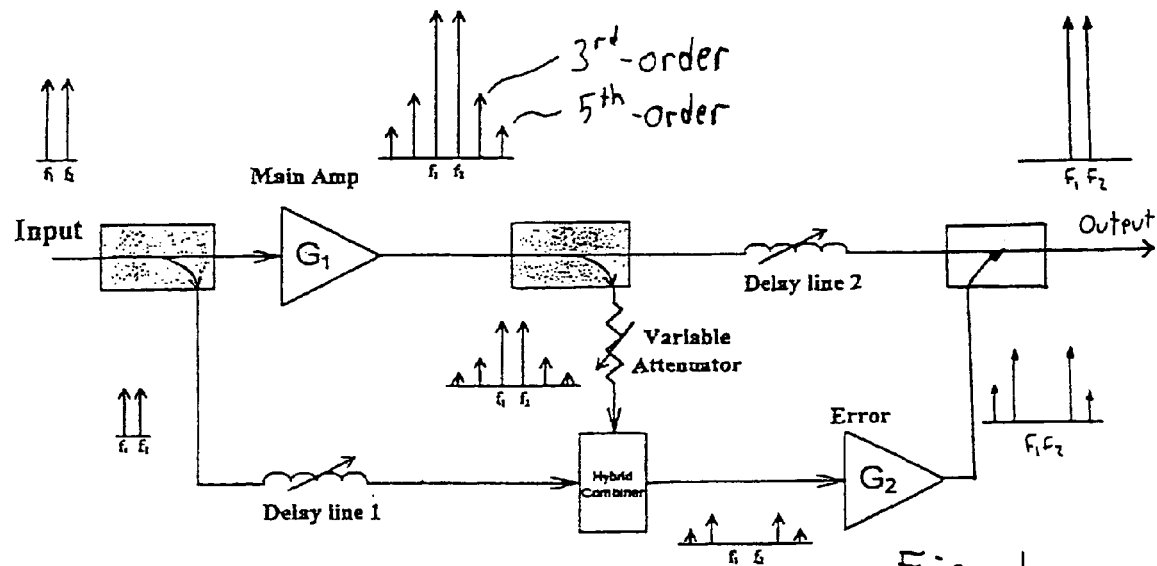
FIG. 1 is a block diagram of a prior art linearized amplifier circuitry.
Figure 2:
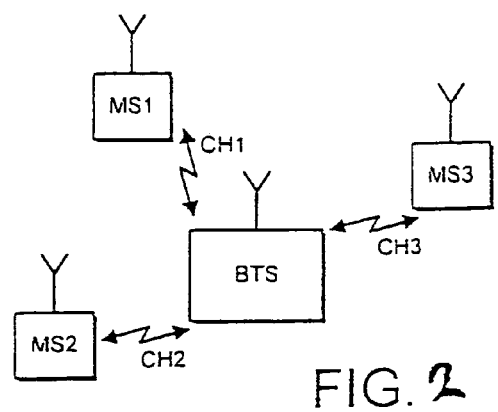
FIG. 2 shows a communication system in which embodiments of the present invention may be used.

Reference will be first made to FIG. 2 illustrating a system in which the embodiments of the invention may be employed. The exemplifying system is a cellular mobile radio communication system allowing a plurality of mobile stations MS1, MS2, MS3 to communicate with a base (transceiver) station BTS in a common cell via respective channels CH1, CH2, CH3. Although not shown, the mobile stations may also move from one cell to another cell. The radio communication between a transmitting station and a receiving station may be implemented in any appropriate manner and may be based on any communication standard. Therefore the radio link as such will not be described in more detail herein. Examples of cellular communication systems include, without being limited to, standards such as AMPS (American Mobile Phone System), DAMPS (Digital AMPS), GSM (Global System for Mobile communications) or various GSM based systems (such as GPRS: General Packet Radio Service), CDMA (Code Division Multiple Access) or the proposed WCDMA (Wideband CDMA), UMTS (Universal Mobile Telecommunications System), IS-95 or IMT 2000 (International Mobile Telecommunications 2000).

Figure 3:
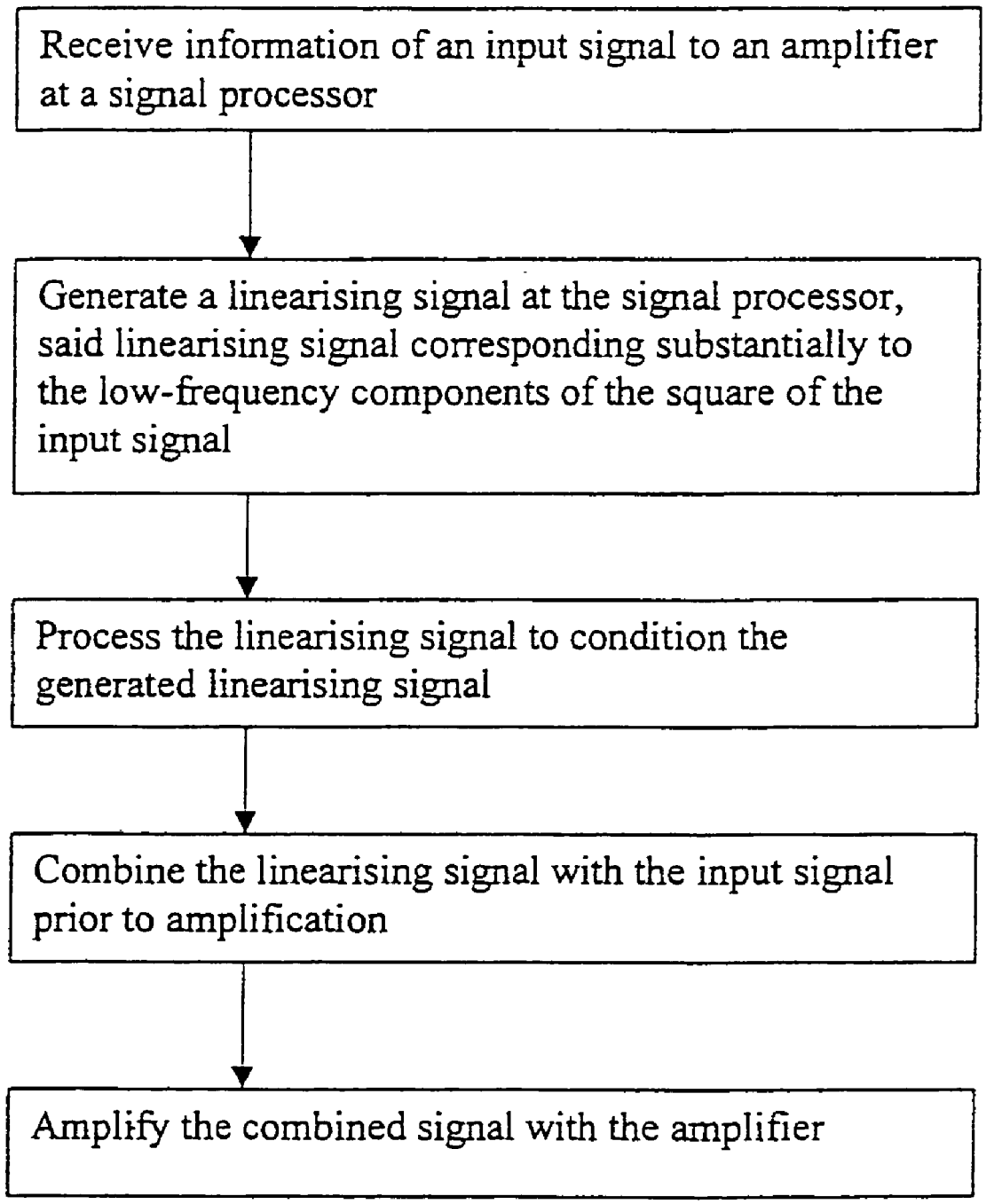
FIG. 3 is a flowchart illustrating the operation of one embodiment of the present invention.

Third-order intermodulation distortion (IMD3) in an amplifier can be significantly reduced by modifying the input signal by the addition of a carefully-engineered linearizing signal, produced from information obtained from the signal to be inputted to the amplifier by appropriate means such as a signal-processing circuit or a data processing device. Steps for an embodiment for the linearizing are illustrated by the flow chart of FIG. 3. In the method a linearizing signal that corresponds substantially to the low-frequency components of the signal that would be obtained if the input signal were squared is generated and processed, preferably in a signal processor. The produced linearizing signal is preferably substantially identical to the low-frequency portion of the square of the input, but may not be formed by actually squaring the input signal or a copy or sample of the input signal. The generated linearizing signal may be processed further by conditioning the components in an appropriate manner, as will be explained below. The generated linearizing signal is subsequently combined with the input signal to form a modified input signal for the amplifier, i.e. a signal containing the original signal and the conditioned signal corresponding to the low-frequency portion of the square of the input signal. The modified input signal is then fed into the amplifier and amplified. As the injected low frequency components will interact with the original input signal and the amplifier to cancel the third-order intermodulation distortion generated by the amplifier, the distortion can be reduced at the amplifier output. The following will outline in more detail both the functionality of this technique as well as some possible embodiments for implementing the processing of the input signal information for generating the linearizing signal.

FIG. 4 shows a schematic block diagram for amplifying multi-tone continuous wave (CW) signals 1 by an amplifier 4 while employing the principles discussed above. Block 5 represents an arbitrary waveform generator (AWG) for outputting the low-frequency linearizing signal 10. The four adjacent RF signals t1 to t4 have a spacing S1 to S3 between each other, respectively. The tones in this embodiment are continuous waves with a periodic waveform (e.g. test signals having a sine waveform and carrying no information). Thus the low frequency portion of the square of the input CW signals will also be a periodic waveform, consisting of 6 second-order difference frequency components at the frequencies S1 to S6. Therefore, once the periodic linearizing signal 10 has been determined for a particular combination of carrier spacings and power levels, it may be continuously outputted from the AWG 5 without adjustment. In a simple implementation the inherent second-order distortion of the amplifier itself is used to produce the square of the input signal. In this case it is enough to digitally sample one period of the periodic low frequency portion of the second-order distortion components at the output of the amplifier 4 before the sample is processed and injected back to the input in a carefully-controlled manner. The periodic low-frequency linearizing signal can be conditioned e.g. by employing convolution or Fourier-Transform techniques, as will be explained later in this description with reference to FIGS. 6 and 7, respectively. An arrangement constructed in accordance with the above principles for multi-tone CW input signals has also been tested, and the test results will be discussed later with reference to FIGS. 8 to 10.

The proposed linearizing technique will now be discussed with reference to a single carrier which has been subjected to modulation prior to amplification. A preferred embodiment will thereafter be discussed in more detail with reference to FIG. 5. Examples of the single carrier applications include handsets and mobile stations. It is appreciated that the embodiment described below can be employed to improve the operating efficiency of amplifiers in other applications as well.

The analysis begins by representing the nonlinear input/output characteristics ("transfer function") of an amplifier by a simple third-order power series of the form often employed:

$$y(t) = ax(t) + bx^2(t) + cx^3(t), \quad (1)$$

where y(t) represents the time-varying output signal, x(t) is the time-varying input signal and a, b and c are the first, second and third-order coefficients of the transfer function respectively.

For the following exemplifying processing, a digitally-modulated carrier signal (designated by 7 in the FIG. 5) is represented in the frequency domain as a carrier supplemented by a baseband spectrum (designated by 1 in FIG. 5):

$$x(t) \Rightarrow X(j\omega) = B(j\omega) \cdot \tfrac{1}{2}[\delta(\omega-\omega_0) + \delta(\omega+\omega_0)], \quad (2)$$

wherein $B(j\omega)$ represents the baseband, $\omega$ is the independent variable of angular frequency, $\omega_0$ is the carrier frequency that the modulated RF signal is centred at, $\tfrac{1}{2}[\delta(\omega+\omega_0)+\delta(\omega-\omega_0)]$ designates a single sinusoidal frequency component at frequency $\omega_0$, and "⊗" designates convolution of the terms.

The second-order term, $x^2(t)$, of the nonlinear transfer function produces the following new output signal components from the above input signal shown:

$$x^2(t) \Rightarrow X(j\omega) \otimes X(j\omega) = \quad (3)$$
$$B(j\omega) \otimes B(j\omega) \otimes 1/4[\delta(\omega - 2\omega_o) + \delta(\omega + 2\omega_o) + 2\delta(\omega)]$$

The third-order term of the transfer function, $x^3(t)$, produces the following new output signal components:

$$x^3(t) \Rightarrow X(j\omega) \otimes X(j\omega) \otimes X(j\omega) = B(j\omega) \otimes B(j\omega) \otimes B(j\omega) \otimes \quad (4)$$
$$1/8[\delta(\omega - 3\omega_o) + \delta(\omega - 3\omega_o) + 3\delta(\omega - \omega_o) + 3\delta(\omega + \omega_o)] =$$
$$B(j\omega) \otimes B(j\omega) \otimes B(j\omega) \otimes 1/8[\delta(\omega - 3\omega_o) + \delta(\omega + 3\omega_o)] +$$
$$\underline{B(j\omega) \otimes B(j\omega) \otimes B(j\omega) \otimes 3/8[\delta(\omega - \omega_o) + \delta(\omega + \omega_o)]}$$

The third-order distortion appearing around the carrier signal is designated in the above by the underlined terms in the third-order expansion (4).

The linearising signal consisting of the low-frequency portion of the square of the input signal that is inputted to the amplifier along with the carrier signal to reduce the third-order distortion can be represented in the frequency domain as:

$$I(j\omega) = \alpha e^{-j\theta}[B(j\omega)B(j\omega)\delta(\omega)], \quad (5)$$

wherein $\alpha e^{-j\theta}$ bulk amplitude and phase-shift term determined by the injection-signal processing means.

If the above "injection" signal is examined, it can be seen to consist of the frequency-domain convolution of the baseband spectrum with itself. The time-domain equivalent of convolution is multiplication, so the injection signal can be formed simply by squaring the time-domain baseband waveform and applying prescribed amplitude and phase-shift. Thus, in order to generate this linearising signal it is not necessary to square the whole RF input signal, it is sufficient to square the baseband signal alone. If the injection signal is added to the original modulated carrier that is centred at frequency $\omega_0$ the input signal and the components generated at the output of the amplifier are changed accordingly:

$$X'(j\omega) = X(j\omega) + I(j\omega) = B(j\omega) \cdot \tfrac{1}{2}[\delta(\omega-\omega_0)+\delta(\omega+\omega_0)] + \alpha e^{j\theta} [B(j\omega)B(j\omega)\delta(\omega)] \quad (6)$$

Second-order distortion components:

$$X'(j\omega) \otimes X'(j\omega) = \quad (7)$$
$$2B(j\omega) \otimes B(j\omega) \otimes 1/4[\delta(\omega - 2\omega_o) + \delta(\omega + 2\omega_o) + 2\delta(\omega)] +$$
$$\alpha e^{-j\theta} B(j\omega) \otimes B(j\omega) \otimes B(j\omega) \otimes [\delta(\omega - \omega_o) + \delta(\omega + \omega_o)]$$

There are now new third-order distortion components produced by the second-order term of the nonlinear transfer-function, as underlined in the above equation (7).

If the underlined second-order term in equation (7) is compared with the underlined third-order distortion around the carrier in the third order equation (4) it can be seen that the second-order amplifier nonlinearity (7) now produces new third-order distortion components around the carrier, identical to those already being produced by the third-order term (4), except for an additional amplitude and phase-shift term $\alpha e^{-j\theta}$. Hence, if the amplitude $\alpha$ is chosen so that the amplitudes of the two sets of underlined components in equations (4) and (7) are equal, and the phase-shift $\theta$ is chosen such that the phases of said components are opposite, distortion cancellation will occur.

Reference will now be made to FIG. 5, which shows a block diagram of a preferred embodiment of the invention. The embodiment may be implemented, for example, in the base transceiver station BTS and/or the mobile stations MS of FIG. 2. A dedicated digital signal processor (DSP) circuit 5 shown in FIG. 5 may be used to generate the required linearizing signal from the baseband waveform that will subsequently modulate the RF carrier to form the input signal. The processing circuit 5 will produce the linearizing signal 10 by squaring the baseband waveform and applying bulk phase and amplitude adjustment to it. This may be operated under control of a control unit 21. The block diagram illustrates a baseband waveform 1 being modulated onto a carrier signal to be inputted into an amplifier 4. The amplifier may be any type of amplifier, such as a radio frequency power amplifier (RF PA) or a small-signal amplifier. The baseband signal may be any signal that may be used for the transmission purposes such as a digital signal or an analogue signal.

Before the baseband signal is inputted into the amplifier, some pre-processing or pre-conditioning of the signal may be performed. For example, the baseband signal (i.e. the information to be carried) must be translated upwards in frequency in order, among other reasons, to enable it to be transmitted through the air and to prevent interference with other transmissions. In FIG. 5 the upwards translation is performed with an upconverter 12 which is arranged to convert intermediate frequency (IF) signals into radio frequency (RF) signals in a known manner. The information signals may be any signals carrying information, such as waveforms carrying, for example, audio, visual or digital information that is translated into electrical signals by transducers such as microphones or cameras or data processing devices.

In addition to upconversion, in order to make efficient use of frequency space, modulation is used in most applications to vary the amplitude, frequency and/or phase of an RF carrier. These pre-processing methods are often referred to as amplitude modulation, frequency modulation and phase modulation, respectively. The signal path to the amplifier 4 may thus include means for processing the carrier signal prior to the signal being inputted into the amplifier. The FIG. 5 arrangement comprises a modulator 3 for the modulation of the carrier signal as discussed above. The input signal is also shown to be passed through a time delay means 2 during the pre-processing of the signal, prior to the inputting of the baseband signal into the modulator 3. The time delay means 2 may be required because the conditioning that may be performed on the injection signal within the circuit 5 will take a finite amount of time. If this processing time is such that the linearizing signal does not arrive at the amplifier 4 correctly time synchronized with the input RF signal, the two sets of third-order distortion components already discussed will not coincide in antiphase, and distortion reduction will not occur. The time delay may thus be required to compensate for this problem. The position of the time delay can be anywhere between the point where the baseband signal is split (14) and the amplifier (4). Also, the time delay 2 may not be required at all if the processing in circuit 5 can be performed rapidly enough.

In addition to the exemplifying pre-processing shown by FIG. 5, there are also other possibilities to process or condition the input signal prior to inputting the carrier signal into an amplifier, such as pre-amplification or filtering. However, as the possible pre-processing techniques are known and do not form a part of the invention as such, they will not be discussed in more detail herein.

After the pre-processing means, the modulated and upconverted signal is inputted into the amplifier 4. The amplified signal is outputted and carried further on a signal path 9 from the output of the amplifier 4 in a known manner.

The circuitry of FIG. 5 includes further a digital signal processing (DSP) circuit 5 in accordance with a preferred embodiment for generating a linearizing signal for use in linearization of the amplifier 4. The processing circuit 5 is arranged to process information it receives via connection 8 from the baseband signal 6 prior to the baseband signal being processed by the pre-processing means. The received information contains information of the baseband, such as the waveform of the baseband, before the baseband is subjected to pre-processing such as upconversion. The baseband information may be obtained at a point 14 located in the signal path 6.

It is to be appreciated that the information may be obtained elsewhere than at the point 14. For example, the IF output of the modulator 3 may be split, and one half thereof may then be downconverted to produce the baseband again, which may then be squared and processed further in the circuit 5.

The processing or linearizing circuit 5 includes means 23 for providing a squaring functionality. For example, the squaring functionality may be implemented in the DSP block 5 as a mathematical function (i.e. by multiplication of a signal with itself), or, in an analogue implementation, e.g. by means of a diode. Phase-shift means 25 and amplitude-adjustment means 24 are also provided for adjusting the bulk amplitude and phase of the digital signal. These may be located in the injection-signal processing means at any position between the points 14 and 15.

The signal processing circuit 5 may also be provided with a variable-gain amplifier 22 or other suitable means, which is arranged to adjust the amplitude of the received information signal. Another variable-gain amplifier 24 or similar means may be provided between the squaring means 23 and the phase-shift means 25, or at any position between the squaring means 23 and the combining means 15. In addition, the circuit 5 may comprise a digital filter 26 for filtering the generated signal prior to it being outputted from the circuit 5.

In the preferred embodiment the processing circuit 5 is a digital signal processing circuit. Thus, if the information from the baseband (e.g. the waveform or logical state of the baseband) is provided in an analogue form and the processing circuit comprises digital signal processing, it may be necessary to provide an analogue to digital converter (ADC) 20 for converting the information signal into digital form. However, the input information signal 8 may already be in a suitable format for digital processing, whereby the converter 20 would not be required. Correspondingly, if the processing block 5 is implemented digitally a digital to analogue converter 27 or other suitable means may be required for converting the generated linearizing signal into a format suitable for combining with the carrier signal.

It is possible, though not necessarily essential, to provide filtering or other suitable means 26 (digital or analogue) to predistort the injection signal in order to compensate for the effects of any filtering and/or coupling components that may be used in order to combine the separate RF carrier 7 and intermediate frequency (IF) linearizing signal 10.

Although not necessary in all implementations, the operation and various functionalities of the processing circuit 5 may be controlled by the control unit 21. The control unit 21 may be arranged to adjust the various components of the circuit 5 in order to maintain correct operation. The control unit may use external information for the control of the generation and conditioning processing. The other information may include information such as carrier spacing in multicarrier applications, transmission power levels, temperature and so on. An input 28 to the controller represents this "external" information. The control unit is not necessary in all embodiments, and may thus be omitted, in which case the linearizer may be referred to as being "open-loop". According to one possibility the control unit 21 provides at least some of the functionalities of the linearising signal generation and processing components of the circuit 5. In addition, the control unit 21 may be arranged to process possible information provided by a feedback connection 11. An example of the possible feedback control operations will be discussed in more detail later in this description.

In FIG. 5 the linearizing signal 10 is combined with the radio frequency carrier signal at a combination (or "injection") point 15 before the radio frequency signal is inputted into the amplifier 4. In some embodiments it may be necessary to provide low-pass filtering means 13 in the signal path between the linearizing signal generating circuit 5 and the injection point 15 in order to prevent high frequency signals on line 7 from entering the circuit 5 and to minimize the effect of the connection 15 on the RF signal path 7.

According to one possibility the linearizing signal is injected to the amplifier via the DC power-source connection (typically an inductive "bias-feed line" or an inductor having a high impedance at the RF frequency) at the input of the amplifier. In this embodiment the power supply input provides a pre-existing low-pass filtering network.

The above described arrangement facilitates use of low frequency components in the linearizing circuit 5, since the frequency of the baseband information signals transmitted from the detection point 14 to the linearizing circuitry signal generating and processing circuit 5 may be of a considerably lower frequency than the RF carrier signals to be inputted into the amplifier 4 (e.g. at frequencies in the order of kHz or MHz).

Although the above discusses the third-order distortion, the embodiment is analogously applicable in linearization of the fifth-order or even higher order distortion with this technique. The experimental results that will be discussed below have shown improvement in fifth-order distortion as well. The fifth-order distortion also appears around the carrier, but is not as problematic as the third-order distortion in most instances, which tends to dominate.

Figure 6:
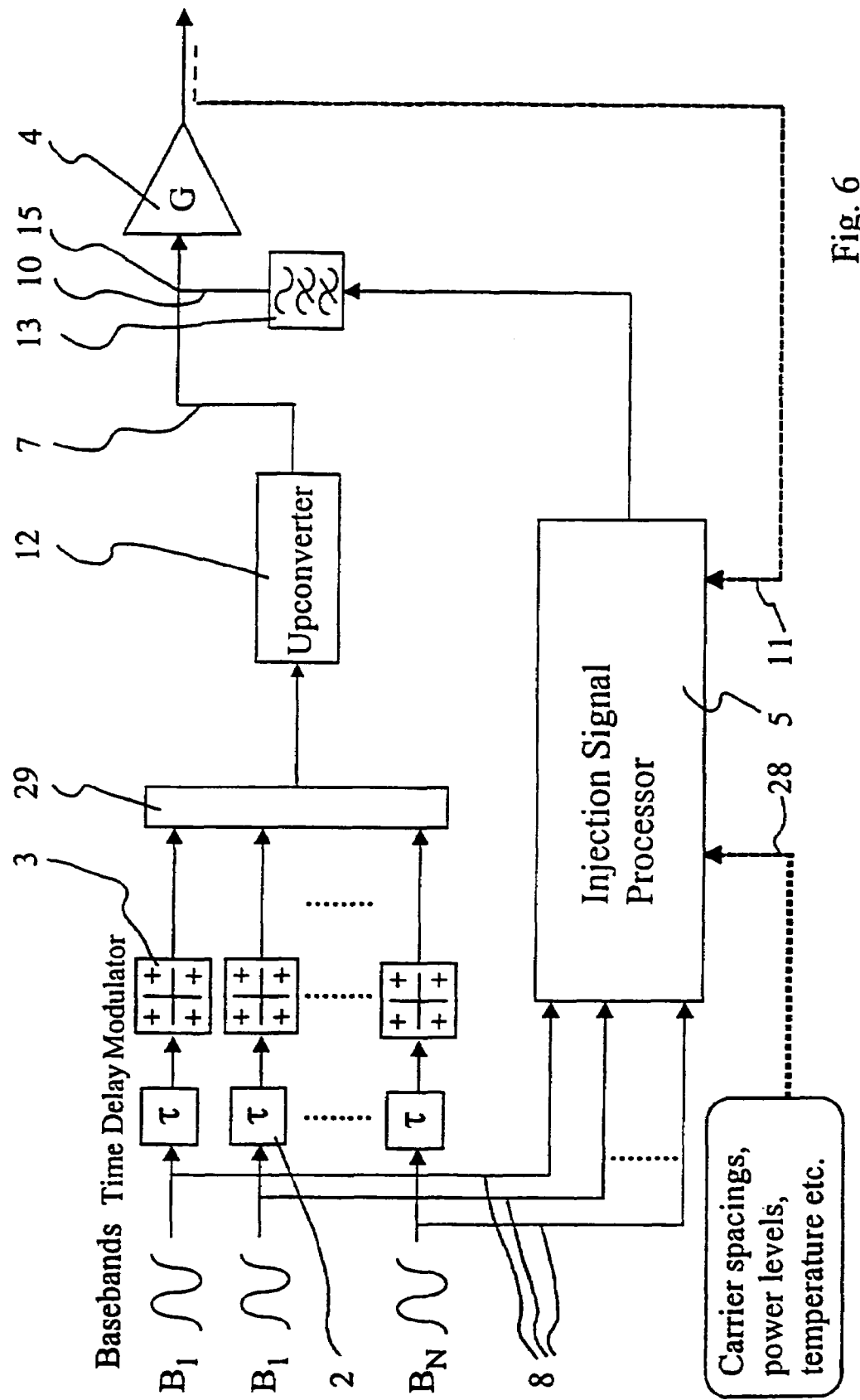
FIG. 6 is a block diagram of circuitry in accordance with a further embodiment of the present invention.

Embodiments of the invention may also be used to linearize a multi-carrier power amplifier. An example of the possible multi-carrier applications is the base station BTS of FIG. 2. FIG. 6 shows a block diagram of possible circuitry for implementing a multi-carrier application for amplifying N carriers. The main components of the exemplifying multi-carrier implementation of FIG. 6 correspond substantially to the single carrier implementation of FIG. 5 and will thus not be explained in detail. However, combining means 29 are required to combine the N modulated signals. The following will discuss an exemplifying analysis on which the multi-carrier linearizer may be based.

A two-carrier input signal, one centred at $\omega_1$ and the other at $\omega_2$, may be represented in the frequency domain by the following expression:

$$X_{in}(j\omega) = B_1(j\omega) \otimes [\delta(\omega - \omega_1) + \delta(\omega + \omega_1)] + \qquad (8)$$
$$B_2(j\omega) \otimes [\delta(\omega - \omega_2) + \delta(\omega + \omega_2)]$$

This signal will produce 6 different in-band third-order intermodulation distortion components consisting of different combinations of the two baseband spectrums $B_1(j\omega)$ and $B_2(j\omega)$:

$$X_{in}(j\omega)X_{in}(j\omega)X_{in}(j\omega)= \qquad (9)$$

High-frequency $3^{rd}$-order components at $2\omega_1+\omega_2$, $2\omega_2+\omega_1$, $3\omega_1$, $3\omega_2$ (these high-frequency $3^{rd}$-order components may be easily removed with filtering, and are thus not written here explicitly)

$$X_{in}(j\omega) \otimes X_{in}(j\omega) \otimes X_{in}(j\omega) = \text{High-frequency } 3^{rd}\text{-order components} \qquad (9)$$
at $2\omega_1 + \omega_2$, $2\omega_2 + \omega_1$, $3\omega_1$, $3\omega_2$ (these high-(frequency3)$^{rd}$-order components may be easily removed with filtering, and are thus not written explicitly)

$+ 3/8 B_1(j\omega) \otimes B_1(j\omega) \otimes B_2(j\omega) \otimes$
$[\delta(\omega - (2\omega_1 - \omega_2)) + \delta(\omega + (2\omega_1 - \omega_2))] + 3/8 B_1(j\omega) \otimes B_2(j\omega) \otimes$
$B_2(j\omega) \otimes [\delta(\omega - (2\omega_2 - \omega_1)) + \delta(\omega + (2\omega_2 - \omega_1))] + 3/8 B_1(j\omega) \otimes B_1(j\omega) \otimes$
$B_1(j\omega) \otimes [\delta(\omega - \omega_1) + \delta(\omega + \omega_1)] + 3/4 B_1(j\omega) \otimes$
$B_2(j\omega) \otimes B_2(j\omega) \otimes [\delta(\omega - \omega_1) + \delta(\omega + \omega_1)] + 3/8 B_2(j\omega) \otimes B_2(j\omega) \otimes$
$B_2(j\omega) \otimes [\delta(\omega - \omega_2) + \delta(\omega + \omega_2)] + 3/4 B_1(j\omega) \otimes B_1(j\omega) \otimes B_2(j\omega) \otimes$
$[\delta(\omega - \omega_2)) + \delta(\omega + \omega_2))]$ Squaring the input signal in the time domain is equivalent to self-convolution in the frequency domain, therefore:

$$X_{in}(j\omega)X_{in}(j\omega)= \qquad (10)$$

High-frequency $2^{nd}$ order components at $(\omega_1+\omega_2)$, $2\omega_1$, $2\omega_2$ (the high frequency $2^{nd}$-order components are also not shown explicitly for reasons of brevity)

$$X_{in}(j\omega) \otimes X_{in}(j\omega) = \text{High-frequency } 2^{nd}\text{-order components} \quad (10)$$
$$\text{at } (\omega_1 + \omega_2), 2\omega_1, 2\omega_2 \text{ (the high}$$
$$\text{frequency } 2^{nd}\text{-order components are also}$$
$$\text{not shown explicity for reasons}$$
$$\text{of brevity})$$
$$+ 2B_1(j\omega) \otimes B_1(j\omega) \otimes \delta(\omega) +$$
$$2B_2(j\omega) \otimes B_2(j\omega) \otimes \delta(\omega) +$$
$$2B_1(j\omega) \otimes B_2(j\omega) \otimes [\delta(\omega -$$
$$(\omega_2 - \omega_1)) + \delta(\omega + (\omega_2 - \omega_1))]$$

The last three terms in the above equation (10) represent, in order, the self-convolution of the first baseband, the self-convolution of the second baseband (both centred around $\omega=0$) and the convolution of the first and second basebands together, centred around $\omega_2-\omega_1$ (the frequency spacing between the two RF carriers assuming $\omega_2>\omega_1$). The required linearising signal can thus be generated if the linearising signal generation and processing means is supplied with the two baseband waveforms as well as any appropriate information defining the mutual relations between the carriers, such as the carrier spacing and/or amplitude information.

Now bulk phase and amplitude adjustment is applied to each of these three terms, absorbing the magnitude constants "2" into an amplitude factor, $\alpha$.

The generated linearising signal will therefore be:

$$I(j\omega) = \alpha e^{-j\theta} B_1 \otimes B_1 \otimes \delta(\omega) + \alpha e^{-j\theta} B_2(j\omega) \otimes B_2(j\omega) \otimes \delta(\omega) + \quad (11)$$
$$\alpha e^{-j\theta} B_1(j\omega) \otimes B_2(j\omega) \otimes [\delta(\omega - (\omega_2 - \omega_1)) + \delta(\omega + (\omega_2 - \omega_1))]$$

The new input signal (i.e. the 2 original carriers with the new linearising signal added):

$$X_{in}'(j\omega) = B_1(j\omega) \otimes [\delta(\omega - \omega_1) + \delta(\omega + \omega_1)] + \quad (12)$$
$$B_2(j\omega) \otimes [\delta(\omega - \omega_2) + \delta(\omega + \omega_2)] +$$
$$\alpha e^{-j\theta} B_1 \otimes B_1 \otimes \delta(\omega) + \alpha e^{-j\theta} B_2(j\omega) \otimes B_2(j\omega) \otimes \delta(\omega) +$$
$$\alpha e^{-j\theta} B_1(j\omega) \otimes B_2(j\omega) \otimes [\delta(\omega - (\omega_2 - \omega_1)) + \delta(\omega + (\omega_2 - \omega_1))]$$

Now we find the self-convolution of this composite input signal (or the square of the time-domain equivalent). Again, many components are produced:

$$X_{in}'(j\omega) \otimes X_{in}'(j\omega) = (\text{High frequency } 2^{nd}\text{-order components at} \quad (13)$$
$$(\omega_1 + \omega_2); 2\omega_1, 2\omega_2) +$$
$$\alpha e^{-j\theta} B_1(j\omega) \otimes B_1(j\omega) \otimes B_2(j\omega) \otimes [\delta(\omega -$$
$$(2\omega_1 - \omega_2)) + \delta(\omega + (2\omega_1 - \omega_2))] +$$
$$\alpha e^{-j\theta} B_1(j\omega) \otimes B_2(j\omega) \otimes B_2(j\omega) \otimes [\delta(\omega -$$
$$(2\omega_2 - \omega_1)) + \delta(\omega + (2\omega_2 - \omega_1))] +$$
$$\alpha e^{-j\theta} B_1(j\omega) \otimes B_1(j\omega) \otimes B_1(j\omega) \otimes [\delta(\omega -$$

-continued
$$\omega_1)) + \delta(\omega + \omega_1))] +$$
$$\alpha e^{-j\theta} B_1(j\omega) \otimes B_2(j\omega) \otimes B_2(j\omega) \otimes [\delta(\omega -$$
$$\omega_1)) + \delta(\omega + \omega_1))] +$$
$$\alpha e^{-j\theta} B_2(j\omega) \otimes B_2(j\omega) \otimes B_2(j\omega) \otimes [\delta(\omega -$$
$$\omega_2)) + \delta(\omega + \omega_2))] +$$
$$\alpha e^{-j\theta} B_1(j\omega) \otimes B_1(j\omega) \otimes B_2(j\omega) \otimes [\delta(\omega -$$
$$\omega_2)) + \delta(\omega + \omega_2))]$$

In the same manner as the single-carrier case, it is possible to compare these new second-order products against those being produced by the third-order term (9) as shown above. Again, the only difference is the amplitude and phase-shift term, $ae^{-j\theta}$. This term can be manipulated by the linearizing signal generation means to cause cancellation of the two sets of products. The above can be extended to 3, 4 or any number of modulated carriers with a corresponding increase in the complexity of the required calculations.

According to a further embodiment also disclosed by FIG. 5 and already briefly discussed above, part or all of the signal that appears at the amplifier output may be analyzed and used to control the function of the linearizing signal generation circuitry and to monitor the performance thereof. The information obtained from analyzing the output waveform can be used to maintain the correct linearizing signal amplitude and phase as operating conditions change and the amplifier ages, should this prove necessary. The linearizing signal 10 may thus be based herein on both the information from the baseband (signal 8) and the feedback information from the output of the amplifier 4 (signal 11) as well as other information (provided, for example by input 28) as discussed earlier, such as carrier spacing, power levels, temperature and so on. The processing of the signal 11 can be accomplished by the control unit 21 or by other appropriate means.

In a preferred form of this further embodiment the feedback control is applied periodically to adjust the generation of the linearizing signal. By means of this, the arrangement may vary any adjustment parameters it uses to account for any changes in the characteristics and behavior of the amplifier. However, the feedback control may also be applied continuously by the control unit 21 to the linearizing signal generation process.

Therefore, feedback monitoring and control functionality is not necessarily dynamic as the generation of the linearizing signal may be, because the controller 21 may act periodically i.e. at intervals. The feedback functionality is provided for monitoring the effectiveness of the linearizing signal 10 generated by the processing circuit 5 from the baseband and other relevant information. In case the feedback functionality is not implemented, the arrangement of FIG. 5 may be referred to as an "open-loop" linearizer. In case the feedback functionality is implemented (e.g. by the feedback connection 11 and the controller 21), the implementation may be referred to as a "closed-loop" linearizer.

Digital processing means (filtering or similar) 26 may be used to predistort the injection signal. This predistortion may be necessary in some applications to compensate for the filtering and/or coupling components that must be used in order to combine the separate RF carrier and intermediate frequency (IF) linearizing signals.

Figure 7:
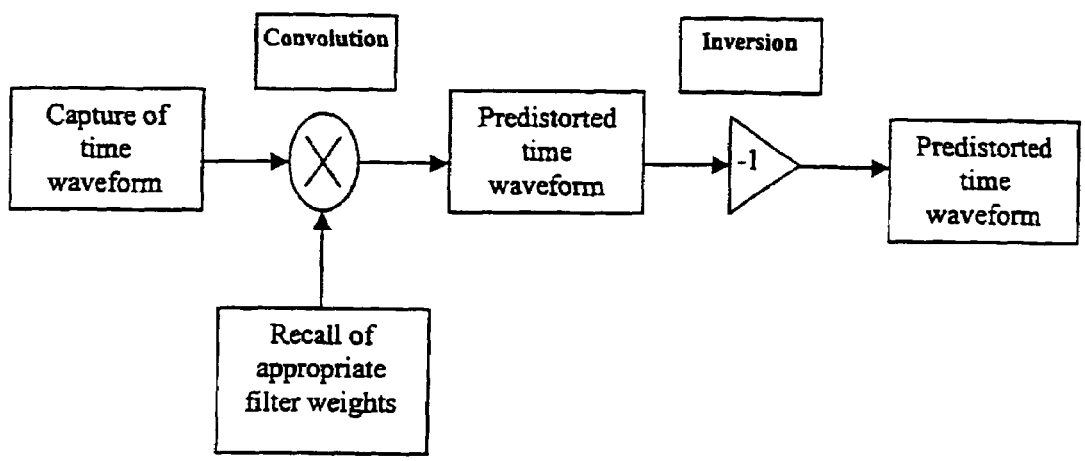
FIGS. 7 and 8 illustrate further embodiments of the invention.
Figure 8:
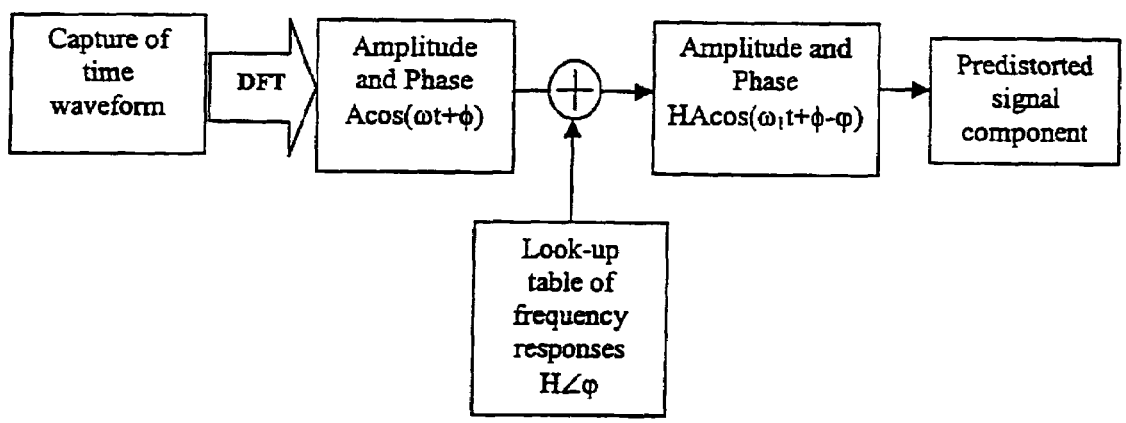

According to a more precise embodiment already briefly mentioned in the context of FIG. 4, the low-frequency portion of the second-order distortion that appears at the amplifier output may be used directly when producing the linearizing signal at the signal processing means, such as a data processing device (e.g. a personal computer or workstation), if the input signal and the low-frequency portion of the square of the input signal are periodic waveforms. This may be operated upon to apply both bulk phase and amplitude adjustment to produce the correct linearizing signal as previously outlined, as well as to predistort the linearising signal. The predistortion may be required to counteract the effects of the low-pass filter networks the linearizing signal passes through both before being sampled at the output of the amplifier and before being injected back into the input of the amplifier. FIGS. 6 and 7 illustrate as block diagrams the functionality of two possible methods to apply phase and amplitude correction to the periodic linearizing signal. FIG. 7 illustrates the use of "Convolution" to process the linearizing signal. FIG. 8 illustrates the use of a "Discrete Fourier-Transform" (DFT) to process the linearizing signal. Briefly, in the convolution method the sampled time waveform is predistorted by convolving the periodic waveform with an impulse-response representing a transfer function that counteracts the effects of the low-pass networks discussed, after which the predistorted time waveform is inverted to adjust the bulk phase of the signal by 180°. In the DFT method the captured time waveform is first translated into the frequency domain by being subjected to a Discrete Fourier Transform at specifiable "spot" frequencies which are equal to the selected carrier spacings (see s1–s6 on FIG. 4). The results of this time-to-frequency transform are the relative amplitude and phase values of each signal component present. A previously collected look-up table of frequency-response data is then referenced to adjust the phase and amplitude of each component, thus counteracting the effect of the low-pass networks already discussed. Unlike the convolution method that uses a best-fit impulse-response to predistort the injection signal, the DFT allows very precise adjustment of the amplitude and phase of each individual frequency component within the linearising signal. It is noted that a Fast Fourier Transform (FFT) may be employed in place of a Discrete Fourier Transform to effect frequency-domain analysis of both periodic and non-periodic signals.

Figure 9:
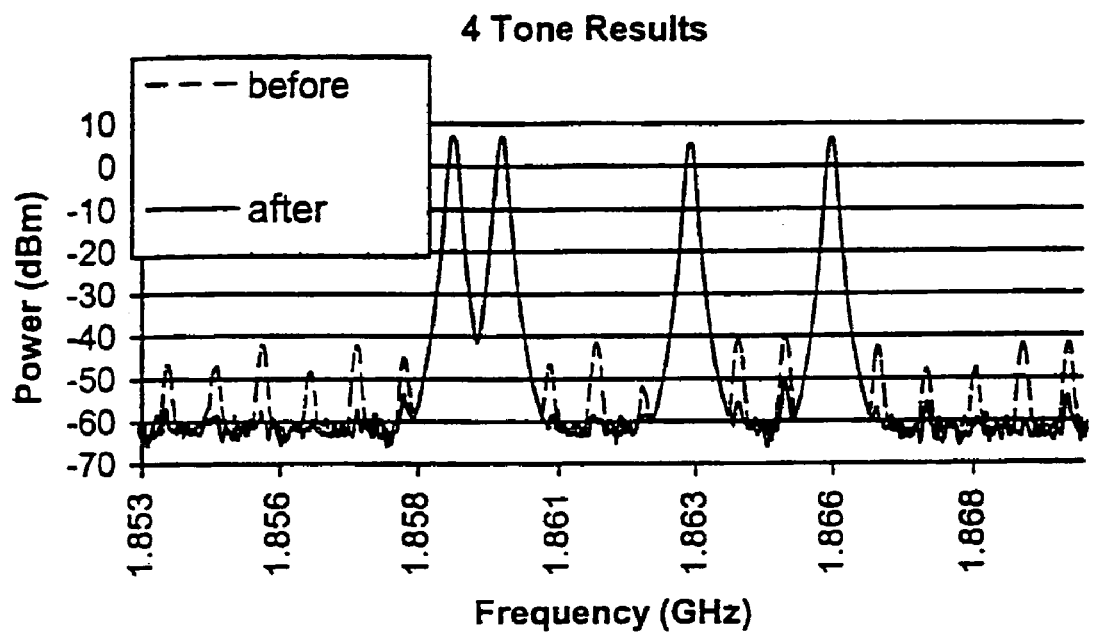
FIGS. 9 to 11 show experimental results obtained for the embodiment of FIG. 3.
Figure 10:
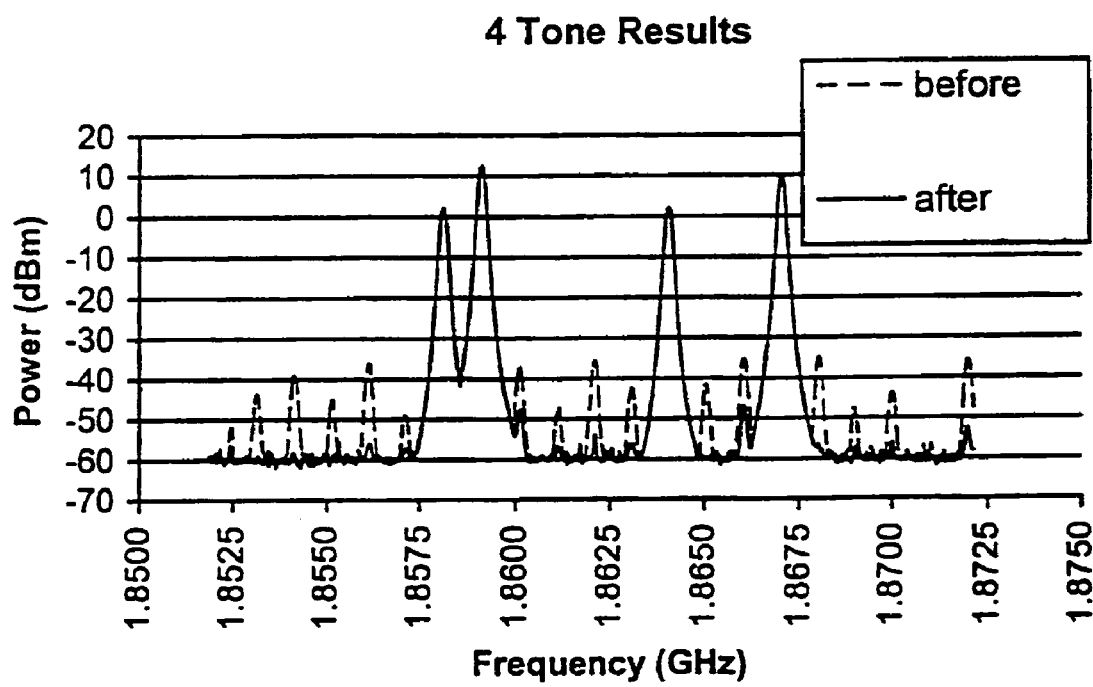
Figure 11:
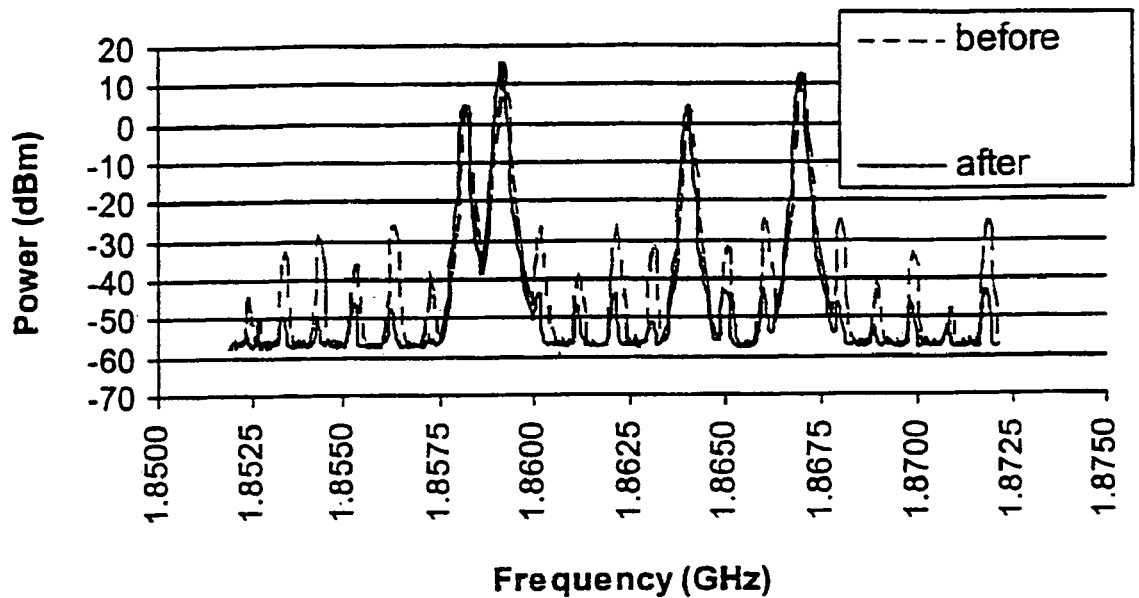

Embodiments of the invention have also been subjected to experimental tests and simulations. Results of some of the tests performed for four-tone continuous waves (CW) test signals are shown by the diagrams of FIGS. 9 to 11. The carrier spacings were selected as 1 MHz, 4 MHz and 3 MHz, respectively, giving 6 second-order difference frequency components 1 MHz, 3 MHz, 4 MHz, 5 MHz, 7 MHz and 8 MHz (for the 6 different carrier spacings, see FIG. 4). The multi-tone test bench was provided with a computer control unit utilizing utilizing VisualBasic to enable data acquisition, waveform processing and basic DSP functionality. The four test-tones were generated by respective signal generators, then pre-amplified and combined in a separate pre-amplifying and combining unit prior to being inputted into a power amplifier (the device under test was a Fujitsu FLL351 ME FET). The injection of the linearizing signal was implemented by means of an arbitrary waveform generator via an inductive bias-feeding line. The IF waveform consisting of the low-frequency portion of the square of the RF input signal was captured at the output of the amplifier with a sampling oscilloscope also via an inductive DC biasfeed line. The amplified output signal was analyzed and recorded by a spectrum analyzer.

These tests demonstrated that injection of a linearizing IF signal can reduce distortion in the RF band with any number of continuous wave (CW) input signals. FIG. 9 shows the result of a 4-tone input signal with equal-power carriers and with the above-discussed DFT predistortion employed in the generation of the linearizing signal. The result obtained when the low-frequency linearizing signal was not added to the RF input signal is shown by a dashed line and the result obtained with the linearizing signal added is shown by a solid line. FIGS. 9 and 10 illustrate results for similar tests, but for carriers with different powers, FIG. 11 illustrating a situation where the power of the tones is 3 dB greater than those shown in FIG. 10.

Figure 12:
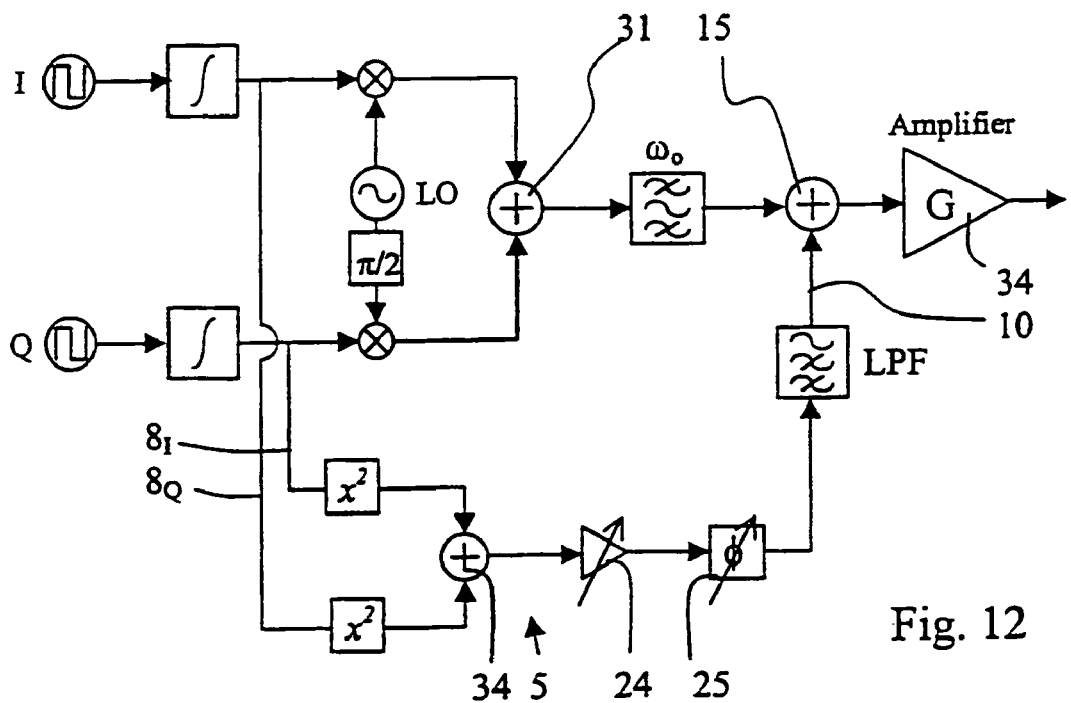
FIG. 12 is a block diagram of amplifier circuitry used for simulating the embodiment of FIG. 5.
Figure 14:
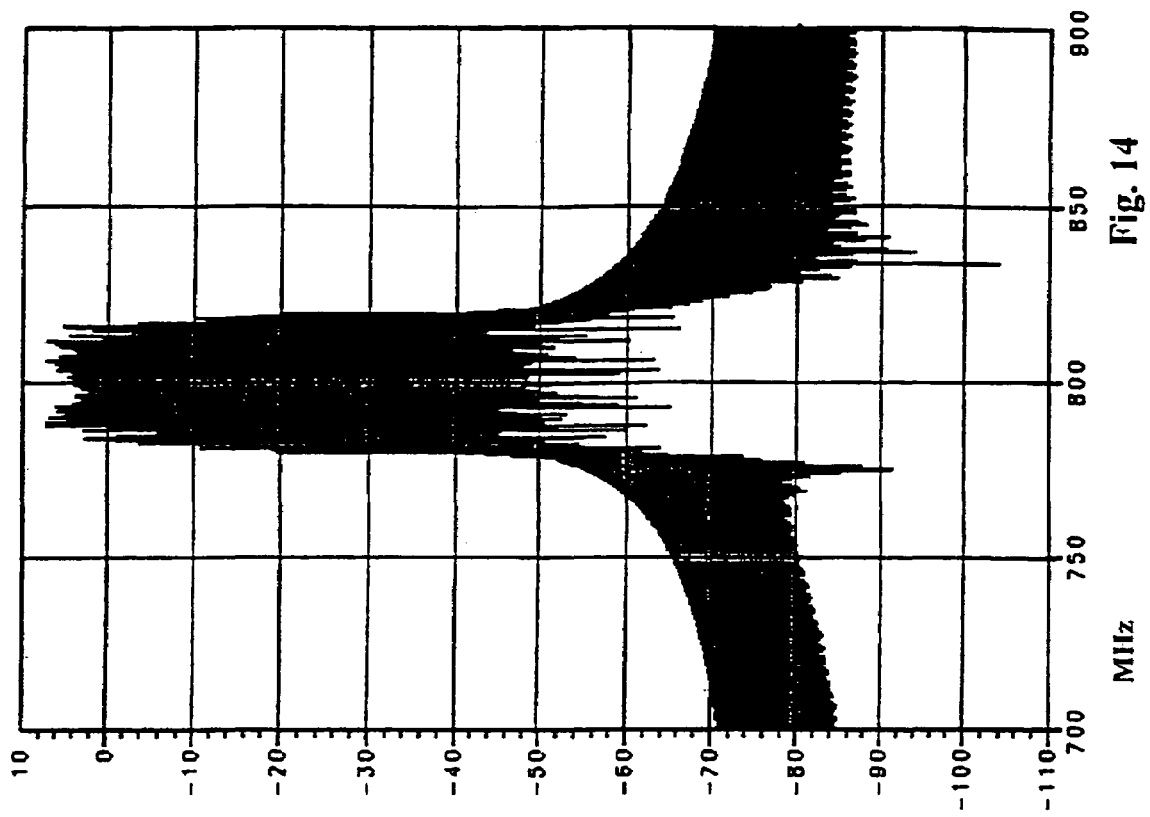
FIGS. 13 and 14 show the results obtained by the FIG. 12 arrangement.
Figure 13:
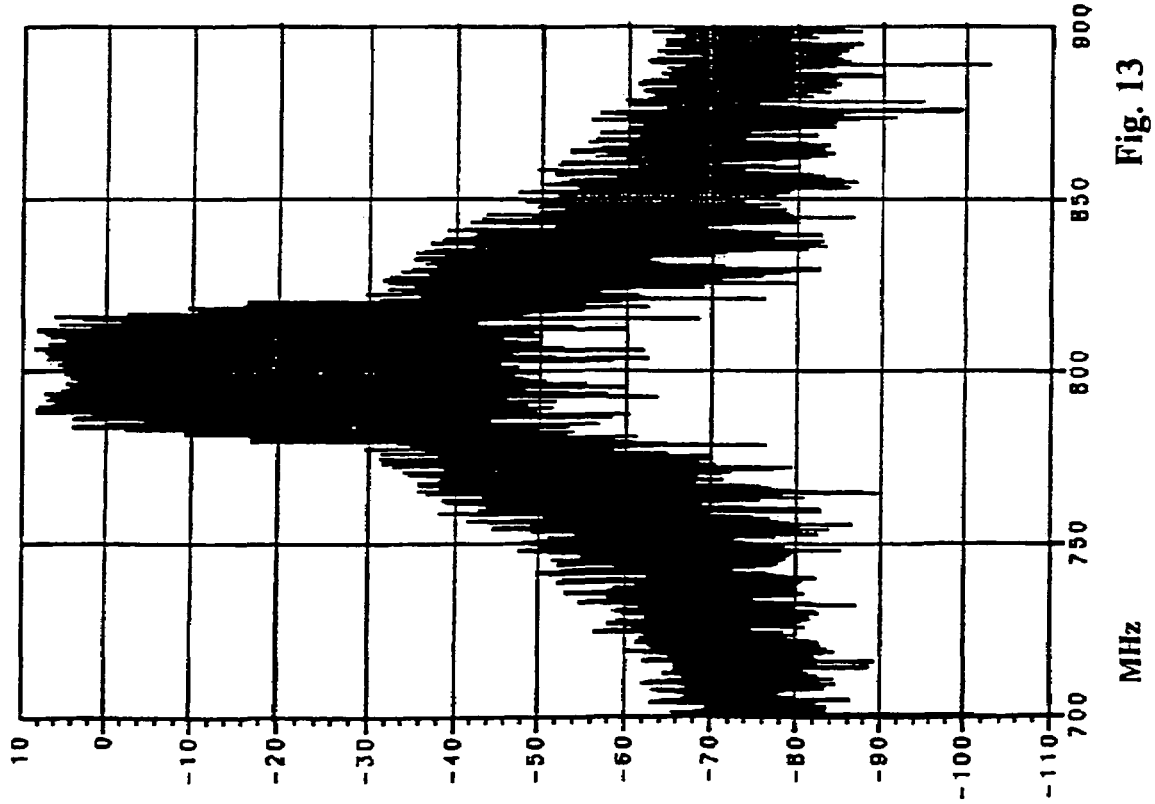

The embodiment of FIG. 5 was subjected to simulation, FIG. 12 being a schematic representation of the circuitry constructed for the simulations. It is noted that while the CW 4-tone results discussed above were obtained through practical experiments, the circuit of FIG. 12 was built and tested with a computer simulation package ("Advanced Design System™" from Hewlett Packard). The simulation results obtained for a modulated carrier are shown in FIGS. 13 and 14. FIG. 13 shows the frequency spectrum of the output of the amplifier when the linearizing signal was not added to the input signal, while FIG. 14 shows the spectrum of the output of the amplifier with the same input carrier signal, modified by the addition of the required linearizing signal.

With reference to FIG. 12, the simulations were accomplished using digital baseband signals consisting of two separate signals, commonly-known as "I" and "Q" for "in-phase" and "quadrature-phase", respectively. These were 2 separate streams of digital data that represent the baseband information when they are used together. The baseband information was separated in this known manner because it enables twice as much information to be carried in the same bandwidth. The digital streams were low-pass filtered to restrict their bandwidth, also in a known manner. Mixers 12—performed the 'upconversion' from IF to RF by each multiplying one of the filtered baseband waveforms by a high-frequency sinusoidal carrier, translating them up to 800 MHz. A sinusoidal 800 MHz local-oscillator (LO) divided the signal into two branches. The branch that was to become the quadrature half of the modulated carrier was subjected to 90 degrees of phase-shift. The mixers were also provided with upconverted RF output connections. The I and Q halves of the signal were then combined in 31 to form the complete RF carrier. The carrier was filtered to remove extraneous signals produced by the upconversion process by a bandpass filter shown connected between units 31 and 15.

The two filtered bit-streams were also provided to the processing circuitry 5 via connections 8I and 8Q, respectively, and the linearizing signal was generated from these bit-streams in the following manner. The baseband I and Q signals were squared before combination. In order to implement this in the simulator, the signal was split and the two halves multiplied together (this could be realized in the same manner in the respective signal processors 5 of FIG. 4 or 5). Following the squaring function the simulation arrangement comprised means for adjusting the bulk amplitude and phase of the linearizing signal, labelled 24 and 25 respectively. The IF injection signal 10 was then added to the upconverted carrier using the idealized combining means represented by the block 15. Finally, the signal was inputted into the realistic nonlinear amplifier model 34 that was to be linearizing.

When comparing the results of FIGS. 13 and 14, it can be seen that a distortion reduction can be achieved by the injection of the required linearizing a signal. The adjacent channel power ratio (ACPR) around the carrier is clearly at a lower level in FIG. 14 than in FIG. 13.

In the accomplished tests and simulations the distortion reduction varied within a range of 10 dB to about 30 dB. However, even bigger improvements in the cancellation of the intermodulation distortion are believed to be possible by the embodiments of the invention.

Even though not tested yet, it is believed that an improvement is also obtainable by the embodiments in cancellation of AM-PM distortion.

It should be appreciated that the above embodiments can also be used in conjunction with other types of linearizers to relax manufacturing tolerances and/or improve overall performance.

It should be appreciated that whilst embodiments of the present invention have been described in relation to stations of a radio communication system, embodiments of the present invention are applicable to any other suitable type of transmitter and/or receiver equipment.

It is also noted herein that while the above describes exemplifying embodiments of the invention, there are several variations and modifications which may be made to the disclosed solution without departing from the scope of the present invention as defined in the appended claims.

The invention claimed is:

1. A method of linearizing an amplifier, the amplifier being provided for amplifying a signal, the method comprising steps of:
generating a linearizing signal that substantially corresponds to low-frequency components of square of an input signal of the amplifier;
processing the linearizing signal;
combining the linearizing signal with the input signal to form a modified input signal; and
amplifying the modified input signal by means of the amplifier, wherein the step of processing the linearizing signal comprises applying amplitude adjustment and phase-shift to the generated linearizing signal, wherein the amplitude of the linearizing signal is chosen such that the amplitude of third-order distortion components generated by a second-order distortion of the amplifier and the amplitude of pre-existing third-order distortion components around a carrier signal are equal.

2. A method according to claim 1, wherein the phase-shift applied to the linearizing signal is such that the phase of the third-order distortion components generated by the second-order distortion of the amplifier is opposite to the phase of the pre-existing third-order distortion around the carrier signal.

3. A method according to claim 2, wherein intermodulation distortion is reduced at the output of the amplifier by means of addition of the linearizing signal to the input signal.

4. A method according to claim 3, wherein the intermodulation distortion comprises third-order intermodulation distortion in a radio frequency power amplifier.

5. A method according to claim 3, wherein the intermodulation distortion comprises fifth-order intermodulation distortion.

6. A method according to claim 5, wherein the linearizing signal is combined with the input signal after the input signal is converted from intermediate frequency to radio frequency.

7. A method of linearizing an amplifier, the amplifier being provided for amplifying a signal, the method comprising steps of: generating a linearizing signal that substantially corresponds to the low-frequency components of the square of an input signal to the amplifier; processing the linearizing signal; combining the linearizing signal with the input signal to form a modified input signal; and amplifying the modified input signal by means of amplifier, wherein the input signal consists of two or more modulated carrier signals comprising squaring two or more baseband waveforms and using information associated with the mutual relations between said carrier signal, wherein the information concerning the mutual relations comprises carrier spacings between said two or more carrier signal.

8. Circuitry comprising:
an amplifier provided with an input for receiving a signal;
processing means for generating a linearizing signal that substantially corresponds to low-frequency components of square of an input signal for the amplifier and for processing the linearizing signal; and
combiner means for combining the linearizing signal with the input signal to form a modified input signal to be applied to the input of the amplifier for amplification, wherein the processing means comprises a digital signal processing circuit, wherein the signal processing circuit is arranged to square baseband waveform of the input signal and to apply amplitude and phase-shift to the low-frequency components resulting from said squaring.

9. Circuitry according to claim 8, wherein the amplifier comprises a radio frequency power amplifier and the intermodulation distortion consisting of third-order and/or fifth-order intermodulation distortion around the input signal.

* * * * *